(12) United States Patent
Chen

(10) Patent No.: US 10,769,985 B1
(45) Date of Patent: Sep. 8, 2020

(54) LIGHT-EMITTING DEVICE DISPLAY

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/371,145

(22) Filed: Apr. 1, 2019

(51) Int. Cl.
*H01L 27/146* (2006.01)
*H01L 21/00* (2006.01)
*G09G 3/32* (2016.01)
*G09G 3/20* (2006.01)
*H01L 27/15* (2006.01)

(52) U.S. Cl.
CPC ............ *G09G 3/32* (2013.01); *G09G 3/2003* (2013.01); *H01L 27/156* (2013.01); *G09G 2300/0452* (2013.01)

(58) Field of Classification Search
CPC ......................... H01L 27/14609; H01L 27/156
USPC ...................................... 438/34, 73; 257/258
See application file for complete search history.

(56) References Cited

U.S. PATENT DOCUMENTS 9,572,222 B2 * 2/2017 Oraw ..................... H05B 45/20
10,394,515 B2 * 8/2019 Park ........................ G06F 1/3265

\* cited by examiner

*Primary Examiner* — Calvin Lee
(74) *Attorney, Agent, or Firm* — CKC & Partners Co., LLC

(57) ABSTRACT

A light-emitting device display comprising a first light-emitting device and a second light emitting device is provided. The first light-emitting device and the second light-emitting device have a first forward voltage and a second forward voltage respectively, and the second forward voltage is higher than the first forward voltage. A first scan voltage and a second scan voltage is respectively provided to the first light-emitting device and the second light-emitting device. The first scan voltage is switched between a first scan-on voltage and a first scan-off voltage. The second scan voltage is switched between a second scan-on voltage and a second scan-off voltage. An absolute value of a difference between the second scan-on voltage and the second scan-off voltage is greater than an absolute value of a difference between the first scan-on voltage and the first scan-off voltage.

13 Claims, 5 Drawing Sheets

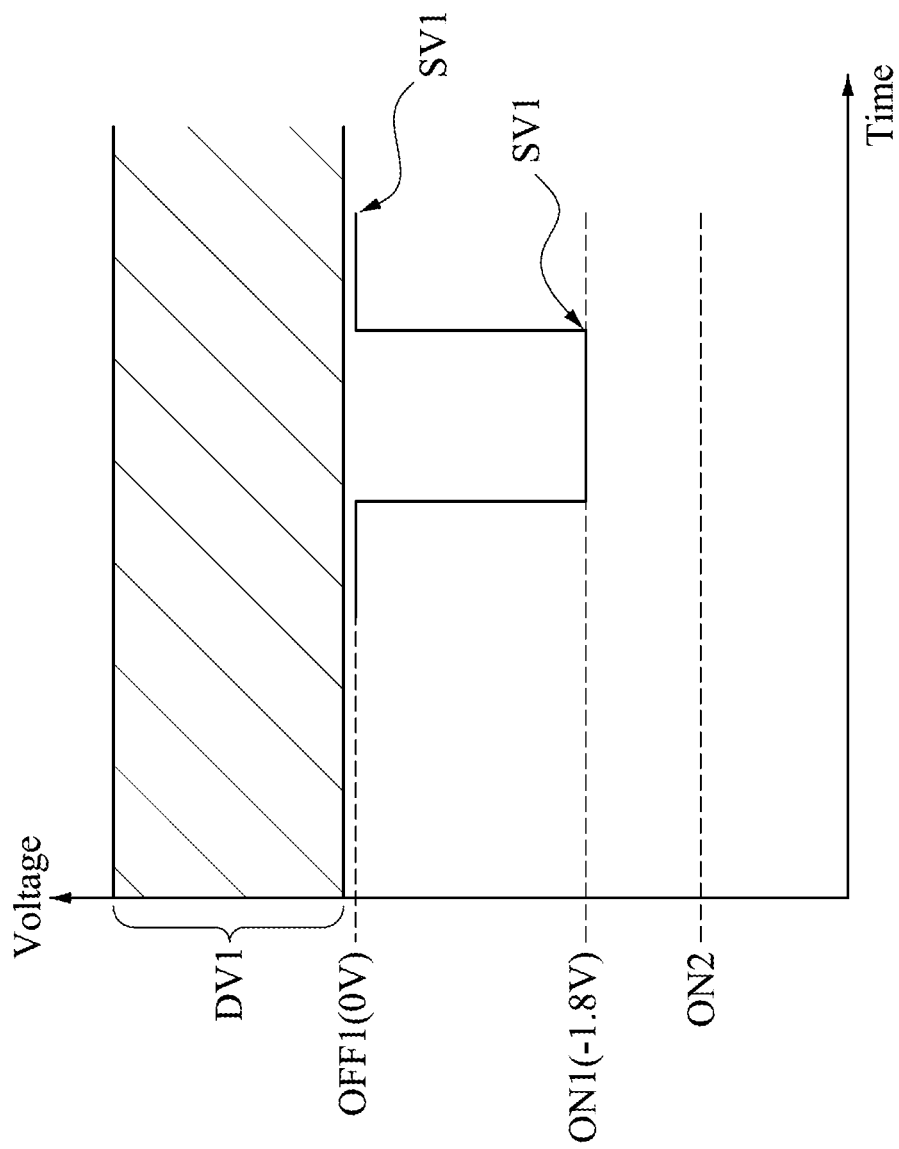

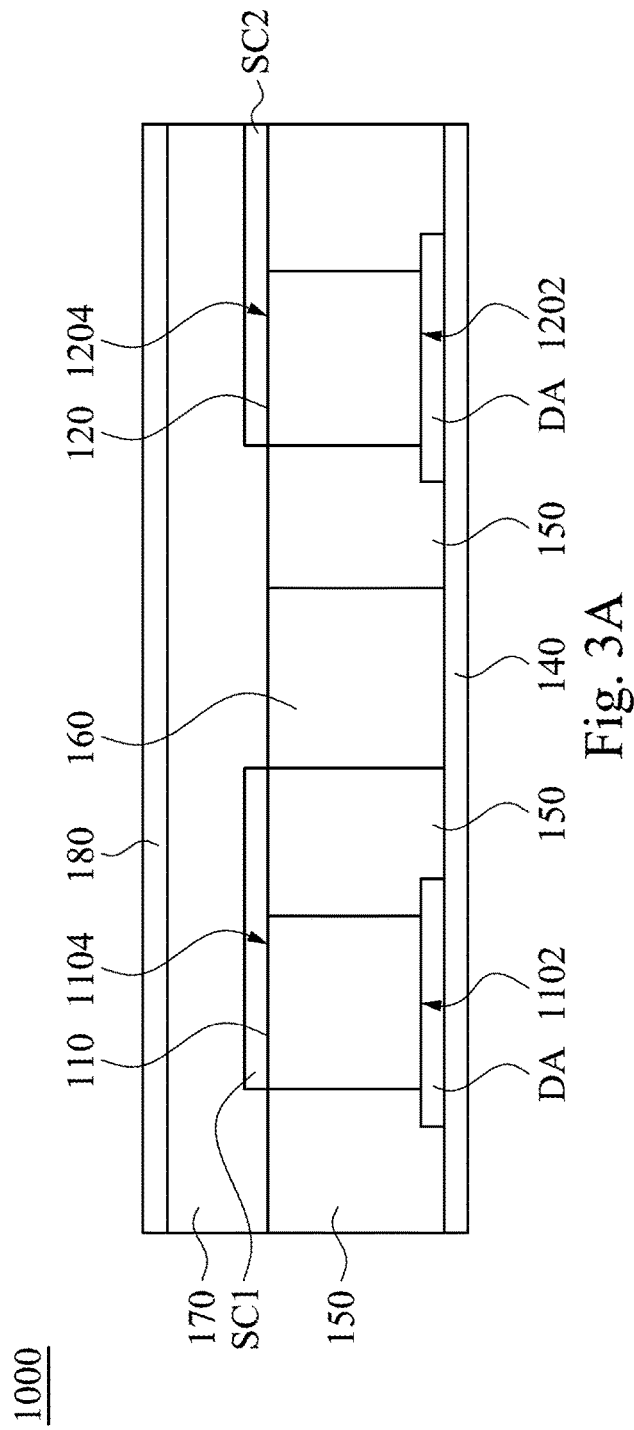
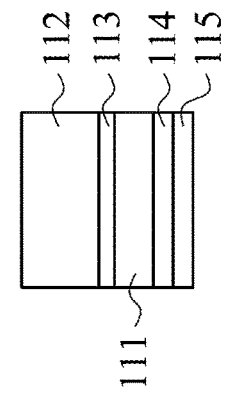
Fig. 3A
Fig. 3B

LIGHT-EMITTING DEVICE DISPLAY

BACKGROUND

Field of Invention

The present disclosure relates to a light-emitting device display with more than one type of scan lines.

Description of Related Art

The statements in this section merely provide background information related to the present disclosure and do not necessarily constitute prior art.

In recent years, light-emitting diodes (LEDs) have become popular in general and commercial lighting applications. In some applications such as displays which are used under a variety of environmental conditions, a wider modulation range of an LED brightness output becomes important.

Furthermore, a resolution requirement for the displays is also gradually increasing.

SUMMARY

According to some embodiments of the present disclosure, a light-emitting device display is provided. The light-emitting device display includes a pixel, a first type scan line, a second type scan line, and two data lines. The pixel includes a first light-emitting device and a second light-emitting device. The first light-emitting device has a first forward voltage. The second light-emitting device has a second forward voltage. The second forward voltage is higher than the first forward voltage. The first type scan line is electrically connected to and in contact with a first end of the first light-emitting device. The first type scan line is configured to receive a first scan voltage and provide the first scan voltage to the first light-emitting device. The first scan voltage is switched between a first scan-on voltage and a first scan-off voltage. The second type scan line is electrically connected to and in contact with a first end of the second light-emitting device. The second type scan line is configured to receive a second scan voltage and provide the second scan voltage to the second light-emitting device. The second scan voltage is switched between a second scan-on voltage and a second scan-off voltage. An absolute value of a difference between the second scan-on voltage and the second scan-off voltage is greater than an absolute value of a difference between the first scan-on voltage and the first scan-off voltage. Two data lines are electrically connected to and in contact with a second end of the first light-emitting device and a second end of the second light-emitting device, respectively. One of the data lines is configured to receive a first data voltage and provide the first data voltage to the first light-emitting device. Another of the data lines is configured to receive a second data voltage and provide the second data voltage to the second light-emitting device. The first data voltage is higher than or equal to the first scan voltage and the second scan voltage, and the second data voltage is higher than or equal to the first scan voltage and the second scan voltage.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 2A is a schematic diagram illustrating a first scan-on voltage and a first scan-off voltage provided to a first light-emitting device according to some embodiments of the present disclosure;

FIG. 3A is a schematic cross-sectional view of a portion of the light-emitting device display according to some embodiments of the present disclosure;

FIG. 3B is a schematic cross-sectional view of a first light-emitting device according to some embodiments of the present disclosure.

DETAILED DESCRIPTION

Figure 1:
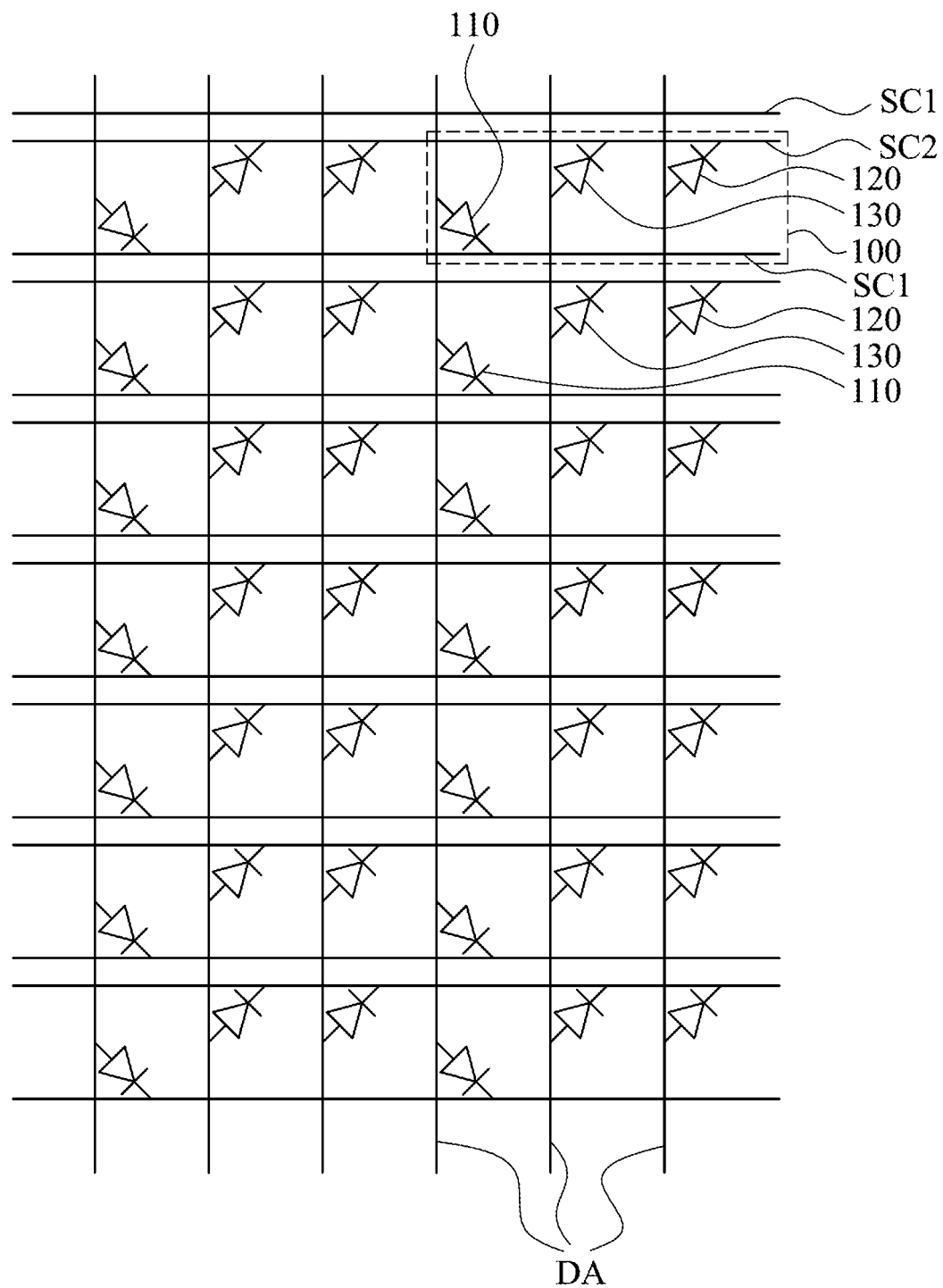
FIG. 1 is a schematic diagram illustrating a light-emitting device display in a circuit way according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 2B:
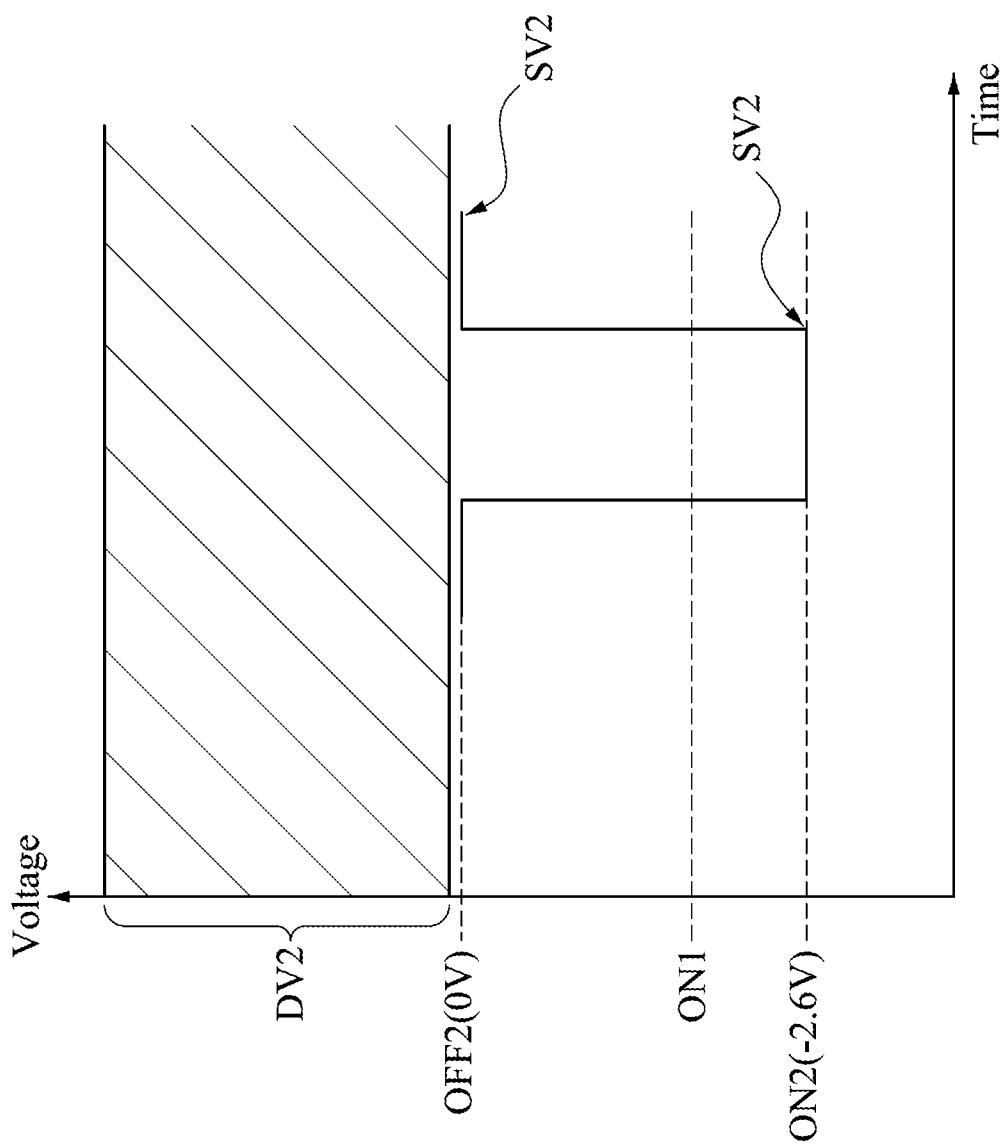
FIG. 2B is a schematic diagram illustrating a second scan-on voltage and a second scan-off voltage provided to a second light-emitting device according to some embodiments of the present disclosure.

Reference is made to FIGS. 1, 2A, and 2B. FIG. 1 is a schematic diagram illustrating a light-emitting device display 1000 in a circuit way. FIG. 2A is a schematic diagram illustrating a first scan-on voltage ON1 and a first scan-off voltage OFF1 provided to a first light-emitting device 110. FIG. 2B is a schematic diagram illustrating a second scan-on voltage ON2 and a second scan-off voltage OFF2 provided to a second light-emitting device 120. The first and second scan-off voltages OFF1, OFF2 can have the same value, but should not be limited thereto. In some embodiments, the light-emitting device display 1000 includes a pixel 100, a first type scan line SC1, a second type scan line SC2, and two data lines DA. The pixel 100 includes at least a first light-emitting device 110 and a second light-emitting device 120. The first light-emitting device 110 has a first forward voltage. The second light-emitting device 120 has a second forward voltage. The first and second forward voltages means voltages which are able to respectively light up the first and the second light-emitting devices 110, 120. The second forward voltage is higher than the first forward voltage. The first light-emitting device 110 can be a red light-emitting diode, and the second light-emitting device 120 can be a blue light-emitting diode, but should not be limited thereto. The first type scan line SC1 is configured to receive a first scan voltage SV1 and provide the first scan voltage SV1 to the first light-emitting device 110. As shown in FIG. 2A, the first scan voltage SV1 is switched between a first scan-on voltage ON1 and a first scan-off voltage OFF1. The first scan-on voltage ON1 is corresponding to a light-emitting mode of the first light-emitting device 110 (i.e., a voltage difference across the first light-emitting device 110 is greater than the first forward voltage of the first light-emitting device 110), and the first scan-off voltage OFF1 is corresponding to a switched-off mode of the first light-emitting device 110 (i.e., a voltage difference across the first light-emitting device 110 is smaller than the forward voltage of the first light-emitting device 110). The second type scan line SC2 is configured to receive a second scan voltage SV2 and provide the second scan voltage SV2 to the second light-emitting device 120. The second scan voltage SV2 is switched between a second scan-on voltage ON2 and a second scan-off voltage OFF2. An absolute value of a difference between the second scan-on voltage ON2 and the second scan-off voltage OFF2 is greater than an absolute value of a difference between the first scan-on voltage ON1 and the first scan-off voltage OFF1 because it is assumed that the second forward voltage is higher than the first forward voltage. It is noted that numbers in the brackets of ON1, ON2, OFF1, and OFF2 (i.e., −1.8, −2.6, and 0) are only exemplifications and should not be limited thereto.

Two data lines DA are electrically connected to the first light-emitting device 110 and the second light-emitting device 120 respectively. One of the data lines DA is configured to receive a first data voltage DV1 and provide the first data voltage DV1 to the first light-emitting device 110. Another of the data lines DA is configured to receive a second data voltage DV2 and provide the second data voltage DV2 to the second light-emitting device. The first data voltage DV1 is higher than or equal to the first scan voltage SV1 and the second scan voltage SV2, and the second data voltage DV2 is higher than or equal to the first scan voltage SV1 and the second scan voltage SV2. In some embodiments, the first data voltage DV1 and the second data voltage DV2 are higher than or equal to a zero voltage.

In some embodiments, an upper limit of a difference between the first data voltage DV1 and the first scan-off voltage OFF1 is less than or equal to the first forward voltage. This condition is to ensure that the first light-emitting device 110 is switched off (i.e., not being lighted up) when the first scan voltage SV1 is switched to the first scan-off voltage OFF1. In some embodiments, an upper limit of a difference between the second data voltage DV2 and the second scan-off voltage OFF2 is less than or equal to the second forward voltage. This condition is to ensure that the second light-emitting device 120 is switched off (i.e., not being lighted up) when the second scan voltage SV2 is switched to the second scan-off voltage OFF2. In some embodiments, both of the upper limits of the difference between the first data voltage DV1 and the first scan-off voltage OFF1 and the difference between the second data voltage DV2 and the second scan-off voltage OFF2 are less than or equal to the first forward voltage. With this condition, the first data voltage DV1 and the second data voltage DV2 can have the same voltage range, thus simplifying a circuit design and/or an arrangement of data voltage sources.

The above embodiments enhance a modulation range of lighting of some light-emitting devices in the pixel 100 of the light-emitting device display 1000. For easier understanding, red, blue, and green light-emitting diodes will be used to explain the enhanced modulation range as follows. Due to significant differences in forward voltages between the red light-emitting diode (e.g., about 1.8 volts (V)) and the blue and the green light-emitting diodes (e.g., about 2.6 V), a modulation range for the blue and the green light-emitting diodes are restricted to a narrower range compared to a modulation range of the red light-emitting diode in conventional passive-matrix displays. Specifically, in conventional passive-matrix displays in which the scan lines receive an ON signal (e.g., about −1.8 V) and an OFF signal (e.g., about 0V) and a data voltage is allowed to be modulated between 1.8 V and 0 V, the modulation range of the red light-emitting diode for lighting is thus about 1.8 V, and the modulation range of the blue and green light-emitting diodes for lighting is thus about 1 V. The 0.8 V difference is due to different forward voltages (e.g., 1.8 V for the red light-emitting diode and 2.6 V for the blue and the green light-emitting diodes) as shown above. However, in the embodiments of the present disclosure, at least two different type of scan lines (e.g., the first type scan line SC1 and the second type scan line SC2) are respectively connected to the red light-emitting diode and the blue (or green) light-emitting diode, such that the modulation range of the blue (or green) light-emitting diode can be the same as the modulation range of the red light-emitting diode, which means the modulation range of the blue (or green) light-emitting diode is enhanced compared to conventional passive-matrix displays. Due to the enhancement of the modulation range, the blue (or green) light-emitting diode is allowed to be brighter, and a contrast of the light-emitting device display 1000 is allowed to be enhanced. Furthermore a total scan time for each frame of the light-emitting device display 1000 is allowed to be decreased because a brighter allowable light intensity emitted from the light-emitting diode can shorten a lighting time period during each scan time. As such, more scan lines can be included in the light-emitting device display 1000 and operated within a given frame time, thus enabling a further enhancement of the resolution of the light-emitting device display 1000. As an example, a voltage difference between the first scan-off voltage OFF1 (e.g., about 0 V) and the first scan-on voltage ON1 (e.g., about −1.8 V) is about 1.8 V, and a voltage difference between the second scan-off voltage OFF2 (e.g., about 0 V) and the second scan-on voltage ON2 (e.g., about −2.6 V) is about 2.6 V. The first data voltage DV1 and the second data voltage DV2 is set in a range from about 0 V to about 1.8 V. As such, the same range of the first data voltage DV1 and the second data voltage DV2 can still result in the same modulation range for the first light-emitting device 110 and the second light-emitting device 120. In this exemplification, the modulation range for the first light-emitting device 110 is from about 1.8 V to about 3.6 V, which is equivalent to 1.8 V, and the modulation range for the second light-emitting device 120 is from about 2.6 V to about 4.4 V, which is also equivalent to about 1.8 V. Said 0.8 V difference of the forward voltages between the red light-emitting diode and the blue (or green) light-emitting diode is compensated by a presence of said two types of scan lines in some embodiments of the present disclosure.

In another scenario when modulation ranges of the data voltages for the red light-emitting diode and the blue (or green) light-emitting diode are allowed to be different, the embodiments of the present disclosure can also enhance the modulation range of lighting of the blue (or green) light-emitting diode compared to the conventional passive-matrix displays. Specifically, a data voltage applied to the red light-emitting diode is allowed to be modulated between about 1.8 V and about 0 V, and a data voltage applied to the blue (or green) light-emitting diode is allowed to be modulated between about 2.6 V and about 0V. Settings for scan voltages are the same as those exemplifications described in previous paragraph. In the conventional passive-matrix displays, the modulation range of the red light-emitting diode for lighting is thus about 1.8 V, and the modulation range of the blue (or green) light-emitting diode for lighting is thus about 1.8 V. However, in the embodiments of the present disclosure, since there are at least two different types of scan lines as mentioned above which are respectively connected to the red light-emitting diode and the blue (or green) light-emitting diode, the modulation range of the blue (or green) light-emitting diode for lighting is thus about 2.6 V, which is substantially enhanced compared to the conventional passive-matrix displays.

Reference is made to FIGS. 3A and 3B. FIG. 3A is a schematic cross-sectional view of a portion of the light-emitting device display 1000 according to some embodiments of the present disclosure. FIG. 3B is a schematic cross-sectional view of a first light-emitting device 110 according to some embodiments of the present disclosure. In some embodiments, a substrate 140 is provided. The first type scan line SC1 is on the substrate 140. The second type scan line SC2 is on the substrate 140. The first type scan line SC1 is electrically connected to and in contact with a first end 1102 of the first light-emitting device 110. The second type scan line SC2 is electrically connected to and in contact with a first end 1202 of the second light-emitting device 120. Two data lines DA are electrically connected to and in contact with a second end 1104 of the first light-emitting device 110 and a second end 1204 of the second light-emitting device 120, respectively. The first end 1102 and the second end 1104 are on opposite sides of the first light-emitting device 110. The first end 1202 and the second end 1204 are on opposite sides of the second light-emitting device 120. A filling material 150 is filled in the light-emitting device display 1000 and is surrounding the first light-emitting device 110 and the second light-emitting device 120. The filling material 150 is made of dielectric materials or photoresists. In some embodiments, an isolation structure 160 is between the first light-emitting device 110 and the second light-emitting device 120 to reduce a crosstalk between different light-emitting devices. The isolation structure 160 can be a light reflective structure, a light absorbing structure, or a combination thereof. In some embodiments, the light reflective structure is on the substrate 140, and the light absorbing structure is on the light reflective structure. In some embodiments, a passivation layer 170 is on the data lines DA, the filling material 150, the isolation structure 160, the first light-emitting device 110, and the second light-emitting device 120. The passivation layer 170 can be used to enhance the amount of light transmitting out from the light-emitting device display. In some embodiments, a refractive index of the passivation layer 170 ranges from about 1.5 to about 2.5. In some embodiments, a cover plate 180 is on the passivation layer 170. In some embodiments, the first light-emitting device 110 includes a first type semiconductor layer 111 and a second type semiconductor layer 112 joined with the first type semiconductor layer 111 through an active layer 113. The first type semiconductor layer 111 can be a p-type semiconductor layer, and the second type semiconductor layer 112 can be an n-type semiconductor layer, but should not be limited thereto. In some embodiments, the first light-emitting device 110 further includes a reflective layer 114 in contact with the first type semiconductor layer 111, and an electrode 115 in contact with a side of the reflective layer 114 opposite to the first type semiconductor layer 111. The reflective layer 114 can be configured to reflect light emitted from the active layer 113, but should not be limited thereto. The electrode 115 is electrically connected to one of the data lines DA via the first end 1102. The second type semiconductor layer 112 is electrically connected to the first type scan line SC1 through the second end 1104. A structural feature of the second light-emitting device 120 is similar to that of the first light-emitting device 110 and will not be repeated herein.

Figure 4:
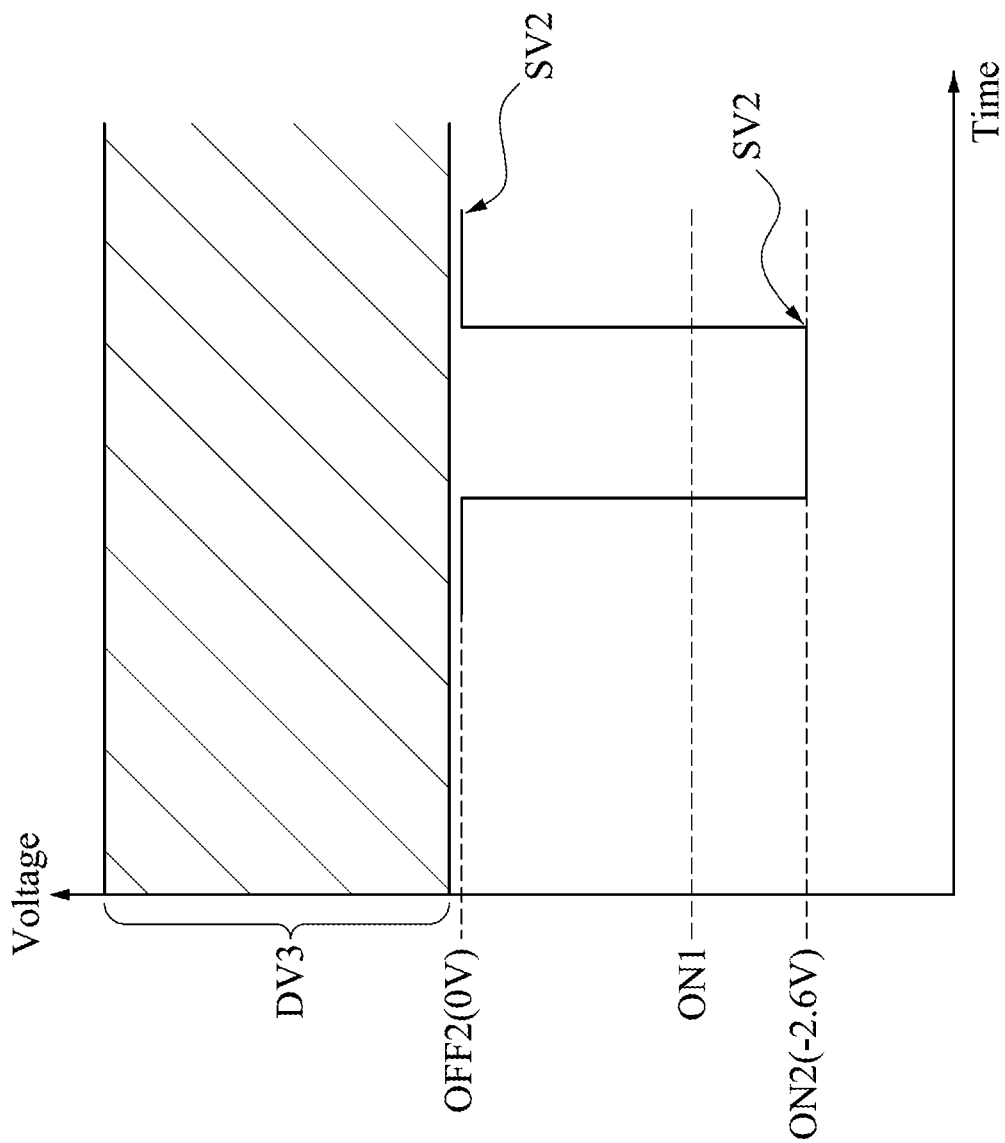
FIG. 4 is a schematic diagram illustrating a second scan-on voltage and a second scan-off voltage provided to a third light-emitting device according to some embodiments of the present disclosure.

Reference is made back to FIG. 1 and is further made to FIG. 4. FIG. 4 is a schematic diagram illustrating a second scan-on voltage ON2 and a second scan-off voltage OFF2 provided to a third light-emitting device 130 according to some embodiments of the present disclosure. The second scan-off voltage OFF2 can be the same as the first scan-off voltages OFF1 but should not be limited thereto. In some embodiments, the pixel 100 further includes another data line DA and the third light-emitting device 130. The third light-emitting device 130 has a third forward voltage. The third forward voltage is higher than the first forward voltage. The third light-emitting device 130 can be a green light-emitting diode, but should not be limited thereto. The second type scan line SC2 is electrically connected to and in contact with a first end of the third light-emitting device 130. Said another data line DA is configured to receive a third data voltage DV3 and provide the third data voltage DV3 to the third light-emitting device 130. Said another data line DA is electrically connected to a second end of the third light-emitting device 130. In some embodiments, the third data voltage DV3 is higher than or equal to the first scan voltage SV1 and the second scan voltage SV2. The above configuration is made due to similar forward voltages of the blue and green light-emitting diodes, such that the blue and green light-emitting diodes can use the same second type scan line SC2. The second and third light-emitting devices 120, 130 may respectively represent the blue and green light-emitting diodes, but should not be limited thereto.

Similar to the embodiments illustrating the second light-emitting device 120, in some embodiments, an upper limit of a difference between the third data voltage DV3 and the second scan-off voltage OFF2 is less than or equal to the third forward voltage. In some embodiments, the upper limit of a difference between the third data voltage DV3 and the second scan-off voltage OFF2 is less than or equal to the smaller one of the second forward voltage and the third forward voltage when the second data voltage DV2 and the third data voltage DV3 have the same voltage range. This condition is to ensure that the third light-emitting device 130 is switched off (i.e., not being lighted up) when the second scan voltage SV2 is switched to the second scan-off voltage OFF2. In some embodiments, the upper limit of the difference between the first data voltage DV1 and the first scan-off voltage OFF1, the upper limit of the difference between the second data voltage DV2 and the second scan-off voltage OFF2, and the upper limit of the difference between the third data voltage DV3 and the second scan-off voltage OFF2 are less than or equal to the first forward voltage. With this condition, the first data voltage DV1, the second data voltage DV2, and the third data voltage DV3 can have the same voltage range, thus simplifying a circuit design and/or an arrangement of data voltage sources. In some embodiments, the third data voltage DV3 is higher than or equal to the zero voltage.

In summary, a light-emitting device display having two different types of scan lines which have different on-to-off voltage differences are provided to enhance a modulation range of lighting. Light emitting devices having different forward voltages can have greater modulation range. Furthermore, due to the enhancement of the modulation range, a contrast and a resolution of the light-emitting device display is allowed to be further enhanced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A light-emitting device display, comprising:
   a pixel comprising:
      a first light-emitting device having a first forward voltage;
      a second light-emitting device having a second forward voltage,
   wherein the second forward voltage is higher than the first forward voltage;
   a first type scan line electrically connected to and in direct contact with a first end of the first light-emitting device, wherein the first type scan line is configured to receive a first scan voltage and provide the first scan voltage to the first light-emitting device, and the first scan voltage is switched between a first scan-on voltage and a first scan-off voltage;
   a second type scan line electrically connected to and in direct contact with a first end of the second light-emitting device, wherein the second type scan line is configured to receive a second scan voltage and provide the second scan voltage to the second light-emitting device, the second scan voltage is switched between a second scan-on voltage and a second scan-off voltage, and an absolute value of a difference between the second scan-on voltage and the second scan-off voltage is greater than an absolute value of a difference between the first scan-on voltage and the first scan-off voltage; and
   two data lines electrically connected to and in contact with a second end of the first light-emitting device and a second end of the second light-emitting device, respectively, wherein one of the data lines is configured to receive a first data voltage and provide the first data voltage to the first light-emitting device, another of the data lines is configured to receive a second data voltage and provide the second data voltage to the second light-emitting device, the first data voltage is higher than or equal to the first scan voltage and the second scan voltage, and the second data voltage is higher than or equal to the first scan voltage and the second scan voltage.

2. The light-emitting device display of claim 1, wherein an upper limit of a difference between the first data voltage and the first scan-off voltage and an upper limit of a difference between the second data voltage and the second scan-off voltage are less than or equal to the first forward voltage.

3. The light-emitting device display of claim 1, wherein an upper limit of a difference between the second data voltage and the second scan-off voltage is less than or equal to the second forward voltage.

4. The light-emitting device display of claim 1, wherein an upper limit of a difference between the first data voltage and the first scan-off voltage is less than or equal to the first forward voltage.

5. The light-emitting device display of claim 1, wherein the first data voltage and the second data voltage are higher than or equal to a zero voltage.

6. The light-emitting device display of claim 1, wherein the second light-emitting device is a blue light-emitting diode.

7. The light-emitting device display of claim 1, wherein the first light-emitting device is a red light-emitting diode.

8. The light-emitting device display of claim 1, wherein the pixel further comprises a third data line and a third light-emitting device having a third forward voltage higher than the first forward voltage, the second type scan line is electrically connected to and in contact with a first end of the third light-emitting device, the third data line is configured to receive a third data voltage and provide the third data voltage to the third light-emitting device, the third data line is electrically connected to a second end of the third light-emitting device, and the third data voltage is higher than or equal to the first scan voltage and the second scan voltage.

9. The light-emitting device display of claim 8, wherein an upper limit of a difference between the third data voltage and the second scan-off voltage is less than or equal to the smaller one of the second forward voltage and the third forward voltage.

10. The light-emitting device display of claim 8, wherein an upper limit of a difference between the third data voltage and the second scan-off voltage is less than or equal to the third forward voltage.

11. The light-emitting device display of claim 8, wherein an upper limit of a difference between the third data voltage and the second scan-off voltage is less than or equal to the first forward voltage.

12. The light-emitting device display of claim 8, wherein the third data voltage is higher than or equal to a zero voltage.

13. The light-emitting device display of claim 8, wherein the third light-emitting device is a green light-emitting diode.

* * * * *